US008085458B2

(12) United States Patent
Wang et al.

(10) Patent No.: US 8,085,458 B2
(45) Date of Patent: Dec. 27, 2011

(54) DIFFUSION BARRIER LAYER FOR MEMS DEVICES

(75) Inventors: Hsin-Fu Wang, Fremont, CA (US); Ming-Hau Tung, San Francisco, CA (US); Stephen Zee, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 12/614,311

(22) Filed: Nov. 6, 2009

(65) Prior Publication Data
US 2010/0046058 A1    Feb. 25, 2010

Related U.S. Application Data

(62) Division of application No. 11/261,236, filed on Oct. 28, 2005, now Pat. No. 7,630,114.

(51) Int. Cl.
*G02B 26/00* (2006.01)
*H01L 21/44* (2006.01)

(52) U.S. Cl. .................. 359/237; 359/290; 438/653

(58) Field of Classification Search .................. 359/237, 359/223, 224, 290, 291, 292, 295, 298, 900; 438/653, 643; 257/751, E23.16
See application file for complete search history.

(56) References Cited

U.S. PATENT DOCUMENTS

| 3,955,880 A | 5/1976 | Lierke |
| 4,403,248 A | 9/1983 | te Velde |
| 4,662,746 A | 5/1987 | Hornbeck |
| 4,859,060 A | 8/1989 | Katagiri et al. |
| 4,954,789 A | 9/1990 | Sampsell |
| 5,083,857 A | 1/1992 | Hornbeck |
| 5,142,414 A | 8/1992 | Koehler |
| 5,172,262 A | 12/1992 | Hornbeck |
| 5,192,395 A | 3/1993 | Boysel et al. |
| 5,212,582 A | 5/1993 | Nelson |
| 5,233,456 A | 8/1993 | Nelson |
| 5,233,459 A | 8/1993 | Bozler et al. |
| 5,311,360 A | 5/1994 | Bloom et al. |
| 5,345,328 A | 9/1994 | Fritz et al. |
| 5,489,952 A | 2/1996 | Gove et al. |
| 5,517,347 A | 5/1996 | Sampsell |

(Continued)

FOREIGN PATENT DOCUMENTS
EP    0 035 299    9/1983
(Continued)

OTHER PUBLICATIONS

Chiou et al., A Novel Capacitance Control Design of Tunable Capacitor Using Multiple Electrostatic Driving Electrodes, IEEE NANO 2001, M 3.1, Nanoelectronics and Giga-Scale Systems (Special Session), Oct. 29, 2001, pp. 319-324.

(Continued)

*Primary Examiner* — William Choi
*Assistant Examiner* — Tuyen Tra
(74) *Attorney, Agent, or Firm* — Knobbe Martens Olson & Bear LLP

(57) ABSTRACT

Described herein is the use of a diffusion barrier layer between metallic layers in MEMS devices. The diffusion barrier layer prevents mixing of the two metals, which can alter desired physical characteristics and complicate processing. In one example, the diffusion barrier layer may be used as part of a movable reflective structure in interferometric modulators.

26 Claims, 15 Drawing Sheets

U.S. PATENT DOCUMENTS

| | | | |
|---|---|---|---|
| 5,526,172 A | 6/1996 | Kanack | |
| 5,535,047 A | 7/1996 | Hornbeck | |
| 5,551,293 A | 9/1996 | Boysel et al. | |
| 5,559,358 A | 9/1996 | Burns et al. | |
| 5,583,688 A | 12/1996 | Hornbeck | |
| 5,600,383 A | 2/1997 | Hornbeck | |
| 5,606,441 A | 2/1997 | Florence et al. | |
| 5,629,790 A | 5/1997 | Neukermans et al. | |
| 5,650,881 A | 7/1997 | Hornbeck | |
| 5,661,591 A | 8/1997 | Lin et al. | |
| 5,673,139 A | 9/1997 | Johnson | |
| 5,673,785 A | 10/1997 | Schlaak et al. | |
| 5,698,771 A * | 12/1997 | Shields et al. | 73/31.05 |
| 5,703,710 A | 12/1997 | Brinkman et al. | |
| 5,710,656 A | 1/1998 | Goosen | |
| 5,740,150 A | 4/1998 | Uchimaru et al. | |
| 5,751,469 A | 5/1998 | Arney et al. | |
| 5,753,418 A | 5/1998 | Tsai et al. | |
| 5,771,321 A | 6/1998 | Stern | |
| 5,784,190 A | 7/1998 | Worley | |
| 5,786,927 A | 7/1998 | Greywall | |
| 5,808,780 A | 9/1998 | McDonald | |
| 5,808,781 A | 9/1998 | Arney et al. | |
| 5,820,770 A | 10/1998 | Cohen et al. | |
| 5,926,309 A | 7/1999 | Little | |
| 5,943,158 A | 8/1999 | Ford et al. | |
| 5,959,763 A | 9/1999 | Bozler et al. | |
| 6,028,690 A | 2/2000 | Carter et al. | |
| 6,031,653 A | 2/2000 | Wang | |
| 6,040,937 A | 3/2000 | Miles | |
| 6,104,525 A | 8/2000 | Min | |
| 6,147,790 A | 11/2000 | Meier et al. | |
| 6,149,190 A | 11/2000 | Galvin et al. | |
| 6,172,797 B1 | 1/2001 | Huibers | |
| 6,195,196 B1 | 2/2001 | Kimura et al. | |
| 6,201,633 B1 | 3/2001 | Peeters et al. | |
| 6,215,221 B1 | 4/2001 | Cabuz et al. | |
| 6,229,683 B1 | 5/2001 | Goodwin-Johansson | |
| 6,288,472 B1 | 9/2001 | Cabuz et al. | |
| 6,288,824 B1 | 9/2001 | Kastalsky et al. | |
| 6,295,154 B1 | 9/2001 | Laor et al. | |
| 6,351,329 B1 | 2/2002 | Greywal | |
| 6,358,021 B1 | 3/2002 | Cabuz | |
| 6,396,097 B2 * | 5/2002 | Joo | 257/296 |
| 6,407,851 B1 | 6/2002 | Islam et al. | |
| 6,418,006 B1 | 7/2002 | Liu et al. | |
| 6,433,917 B1 | 8/2002 | Mei et al. | |
| 6,446,486 B1 | 9/2002 | deBoer et al. | |
| 6,456,420 B1 | 9/2002 | Goodwin-Johansson | |
| 6,473,274 B1 | 10/2002 | Maimone et al. | |
| 6,513,911 B1 | 2/2003 | Ozaki et al. | |
| 6,522,801 B1 | 2/2003 | Aksyuk et al. | |
| 6,618,187 B2 | 9/2003 | Pilossof | |
| 6,625,047 B2 | 9/2003 | Coleman, Jr. | |
| 6,635,919 B1 | 10/2003 | Melendez et al. | |
| 6,639,724 B2 | 10/2003 | Bower et al. | |
| 6,650,455 B2 | 11/2003 | Miles | |
| 6,657,832 B2 | 12/2003 | Williams et al. | |
| 6,666,561 B1 | 12/2003 | Blakley | |
| 6,674,562 B1 | 1/2004 | Miles | |
| 6,680,792 B2 | 1/2004 | Miles | |
| 6,713,235 B1 * | 3/2004 | Ide et al. | 430/313 |
| 6,741,383 B2 | 5/2004 | Huibers et al. | |
| 6,859,301 B1 | 2/2005 | Islam et al. | |
| 6,867,896 B2 | 3/2005 | Miles | |
| 6,952,304 B2 | 10/2005 | Mushika et al. | |
| 6,958,847 B2 | 10/2005 | Lin | |
| 6,967,757 B1 | 11/2005 | Allen et al. | |
| 6,972,891 B2 | 12/2005 | Patel et al. | |
| 6,982,820 B2 | 1/2006 | Tsai | |
| 6,995,890 B2 | 2/2006 | Lin | |
| 7,006,272 B2 | 2/2006 | Tsai | |
| 7,053,737 B2 | 5/2006 | Schwartz et al. | |
| 7,075,700 B2 | 7/2006 | Muenter | |
| 7,082,684 B2 | 8/2006 | Hantshel et al. | |
| 7,110,158 B2 | 9/2006 | Miles | |
| 7,119,945 B2 | 10/2006 | Cummings et al. | |
| 7,123,216 B1 | 10/2006 | Miles | |
| 7,187,489 B2 * | 3/2007 | Miles | 359/290 |
| 7,198,973 B2 | 4/2007 | Lin et al. | |
| 7,259,865 B2 | 8/2007 | Cummings et al. | |
| 7,289,259 B2 | 10/2007 | Chui et al. | |
| 7,327,510 B2 | 2/2008 | Cummings et al. | |
| 7,534,640 B2 | 5/2009 | Sasagawa et al. | |
| 7,550,794 B2 | 6/2009 | Miles et al. | |
| 7,642,110 B2 | 1/2010 | Miles | |
| 7,710,371 B2 * | 5/2010 | Mei et al. | 345/85 |
| 2001/0028503 A1 | 10/2001 | Flanders et al. | |
| 2001/0040675 A1 | 11/2001 | True et al. | |
| 2002/0015215 A1 | 2/2002 | Miles | |
| 2002/0024292 A1 | 2/2002 | Sakaguchi et al. | |
| 2002/0071169 A1 | 6/2002 | Bowers et al. | |
| 2002/0131682 A1 | 9/2002 | Nasiri et al. | |
| 2002/0135857 A1 | 9/2002 | Fitzpatrick et al. | |
| 2003/0015936 A1 | 1/2003 | Yoon et al. | |
| 2003/0016428 A1 | 1/2003 | Kato et al. | |
| 2003/0029705 A1 | 2/2003 | Qiu et al. | |
| 2003/0043157 A1 | 3/2003 | Miles | |
| 2003/0090350 A1 | 5/2003 | Feng et al. | |
| 2003/0112096 A1 | 6/2003 | Potter | |
| 2003/0119221 A1 | 6/2003 | Cunningham et al. | |
| 2003/0123126 A1 | 7/2003 | Meyer et al. | |
| 2003/0141561 A1 | 7/2003 | Fischer et al. | |
| 2003/0156315 A1 | 8/2003 | Li et al. | |
| 2003/0202264 A1 | 10/2003 | Weber et al. | |
| 2003/0202265 A1 | 10/2003 | Reboa et al. | |
| 2003/0210851 A1 | 11/2003 | Fu et al. | |
| 2004/0008396 A1 | 1/2004 | Stappaerts | |
| 2004/0008438 A1 | 1/2004 | Sato | |
| 2004/0027671 A1 | 2/2004 | Wu et al. | |
| 2004/0051929 A1 | 3/2004 | Sampsell et al. | |
| 2004/0056742 A1 | 3/2004 | Dabbaj | |
| 2004/0058532 A1 | 3/2004 | Miles et al. | |
| 2004/0070813 A1 | 4/2004 | Aubuchon | |
| 2004/0100677 A1 | 5/2004 | Huibers et al. | |
| 2004/0125347 A1 | 7/2004 | Patel et al. | |
| 2004/0136045 A1 | 7/2004 | Tran | |
| 2004/0160143 A1 | 8/2004 | Shreeve et al. | |
| 2004/0179268 A1 | 9/2004 | Barbastathis et al. | |
| 2004/0207497 A1 | 10/2004 | Hsu et al. | |
| 2004/0209195 A1 | 10/2004 | Lin | |
| 2004/0218251 A1 | 11/2004 | Piehl et al. | |
| 2004/0233498 A1 | 11/2004 | Starkweather et al. | |
| 2004/0233553 A1 | 11/2004 | Shibata et al. | |
| 2004/0240032 A1 | 12/2004 | Miles | |
| 2005/0038950 A1 | 2/2005 | Adelmann | |
| 2005/0195464 A1 | 9/2005 | Faase et al. | |
| 2005/0231793 A1 | 10/2005 | Sato | |
| 2006/0066936 A1 | 3/2006 | Chui et al. | |
| 2006/0203325 A1 | 9/2006 | Faase et al. | |
| 2008/0088912 A1 | 4/2008 | Miles | |
| 2010/0079849 A1 | 4/2010 | Floyd | |
| 2011/0115762 A1 | 5/2011 | Sasagawa et al. | |

FOREIGN PATENT DOCUMENTS

| | | |
|---|---|---|
| EP | 0 695 959 | 2/1996 |
| EP | 0 788 005 | 8/1997 |
| EP | 1 275 997 | 1/2003 |
| EP | 1 473 691 | 11/2004 |
| EP | 1 640 768 | 3/2006 |
| FR | 2824643 | 10/1999 |
| JP | 8-62518 | 3/1996 |
| JP | 9-127439 | 5/1997 |
| JP | 2002-062490 | 2/2002 |
| JP | 2002-219696 | 8/2002 |
| JP | 2002-277771 | 9/2002 |
| JP | 2002-344111 | 11/2002 |
| JP | 2003195201 | 7/2003 |
| JP | 2004-137519 | 5/2004 |
| JP | 2004157527 | 6/2004 |
| JP | 2005 211997 | 8/2005 |
| JP | 2005-0286431 | 10/2005 |
| WO | WO 91/05284 | 4/1991 |
| WO | WO 01/22454 | 3/2001 |
| WO | WO 02/075803 | 9/2002 |
| WO | WO 02/079853 | 10/2002 |
| WO | WO 03/014789 | 2/2003 |

| WO | WO 03/052506 | 6/2003 |
| WO | WO 03/107094 | 12/2003 |
| WO | WO 2005/006364 | 1/2005 |
| WO | WO 2005/066596 | 7/2005 |

OTHER PUBLICATIONS

Joannopoulos et al., Photonic Crystals: Molding the Flow of Light, Princeton University Press (1995).

Lin et al., Free-Space Micromachined Optical Switches for Optical Networking, IEEE Journal of Selected Topics in Quantum Electronics, 5,(1):4-9 (Jan./Feb. 1999).

Magel, Integrated Optic Devices Using Micromachined Metal Membranes, SPIE vol. 2686, 0-8194-2060-Mar. (1996).

Invitation to Pay Additional Fees for PCT/US06/040775 filed Oct. 19, 2006.

ISR and WO for PCT/US06/040775 filed Oct. 19, 2006.

IPRP for PCT/US06/040775 filed Oct. 19, 2006.

Office Action dated Oct. 31, 2007 in U.S. Appl. No. 11/261,236.

Office Action dated May 15, 2008 in U.S. Appl. No. 11/261,236.

Office Action dated Dec. 5, 2008 in U.S. Appl. No. 11/261,236.

Office Actiond dated Sep. 24, 2009 in Chinese App. No. 200680040120.8.

Boucinha et al., 2000, Amorphous silicon air-gap resonators on large-area substrates, Applied Physics Letters, 77(6):907-909.

Notice of Reasons for Rejection dated May 31, 2011 in Japanese App. No. 2008-537782.

* cited by examiner

DIFFUSION BARRIER LAYER FOR MEMS DEVICES

CROSS-REFERENCE TO RELATED APPLICATIONS

This application is a divisional of and claims priority to U.S. patent Application Ser. No. 11/261,236, filed Oct. 28, 2005, which is now U.S. Pat. No. 7,630,114, issued Dec. 8, 2009, and incorporated herein by reference in its entirety.

FIELD OF THE INVENTION

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

One embodiment disclosed herein includes a MEMS device, comprising a mechanical membrane, wherein the membrane includes a first metallic layer, a second metallic layer and a diffusion barrier layer positioned between the first metallic layer and the second metallic layer, wherein the diffusion barrier layer is adapted to substantially inhibit any portion of the first metallic layer from mixing with any portion of the second metallic layer.

Another embodiment disclosed herein includes a method of substantially inhibiting any portion of a first metallic layer from mixing with any portion of a second metallic layer in a MEMS device mechanical membrane, comprising positioning a diffusion barrier layer between the first and second metallic layers.

Another embodiment disclosed herein includes a method of manufacturing a MEMS device, including depositing a first metallic layer, depositing a diffusion barrier layer onto the first metallic layer, depositing a second metallic layer onto the diffusion barrier layer, wherein the diffusion barrier layer is adapted to substantially inhibit any portion of the first metallic layer from mixing with any portion of the second metallic layer, and etching a same pattern in the first metallic layer, diffusion barrier layer, and second metallic layer.

Another embodiment disclosed herein includes a MEMS device, having a mechanical membrane produced by the above process.

Another embodiment disclosed herein includes an interferometric modulator, comprising a movable reflective layer that includes a mirror, a mechanical layer adjacent to the mirror, the mechanical layer adapted to provide mechanical support for the mirror, and a diffusion barrier between the mirror and the mechanical layer, wherein the diffusion barrier is adapted to substantially inhibit mixing of any portion of the mirror with any portion of the mechanical layer.

Another embodiment disclosed herein includes an interferometric modulator, comprising a movable reflective layer that includes reflecting means for reflecting light, mechanical support means for providing mechanical support to the reflecting means, and diffusion barrier means for preventing diffusion between the reflecting means and the mechanical support means.

Another embodiment disclosed herein includes a method of manufacturing an interferometric modulator, including depositing a first metallic layer, depositing a diffusion barrier layer onto the first metallic layer, depositing a second metallic layer onto the diffusion barrier layer, wherein the diffusion barrier layer is adapted to substantially inhibit any portion of the first metallic layer from mixing with any portion of the second metallic layer, and etching a same pattern in the second metallic layer, the diffusion barrier, and the first metallic layer.

Another embodiment disclosed herein includes an interferometric modulator produced by the above process.

Another embodiment disclosed herein includes a method of manufacturing a movable electrode in a MEMS device having a desired tensile stress, including determining a desired tensile stress or range of tensile stress for the movable electrode, forming one or more layers comprising a material having tensile stress, and forming one or more layers comprising a material having compressive stress adjacent to the tensile stress materials, whereby combination of the tensile stress of the compressive stress provide the desired tensile stress or range of tensile stress for the movable electrode.

Another embodiment disclosed herein includes a MEMS device movable electrode produced by the above process.

Another embodiment disclosed herein includes a method of actuating a MEMS structure, comprising applying an electric field to a mechanical membrane in the MEMS structure such that the mechanical membrane moves in response to the electric field, wherein the mechanical membrane includes a first layer of material, a second layer of material, and a diffusion barrier layer positioned between the first layer and the second layer, wherein the diffusion barrier layer is adapted to substantially inhibit any portion of the first layer from mixing with any portion of the second layer.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In many MEMS devices, structures are formed having metallic layers adjacent to each other. These adjacent layers can present unique problems, such as mixing of the metals at their interface to create metal alloys. Such alloys can alter the physical characteristics of the structure. In addition, the alloys may complicate manufacturing since they do not respond to etchants in the same way that the pure metals do. Accordingly, in some embodiments described herein, a diffusion barrier layer is used to prevent metallic interdiffusion and therefore to expand and improve the utilization of composite metallic layers in MEMS devices. In an illustrated embodiment, the diffusion barrier is between a mechanical layer and a reflective layer in an interferometric modulator, particularly between a chromium mechanical layer and an aluminum reflective layer.

Figure 1:
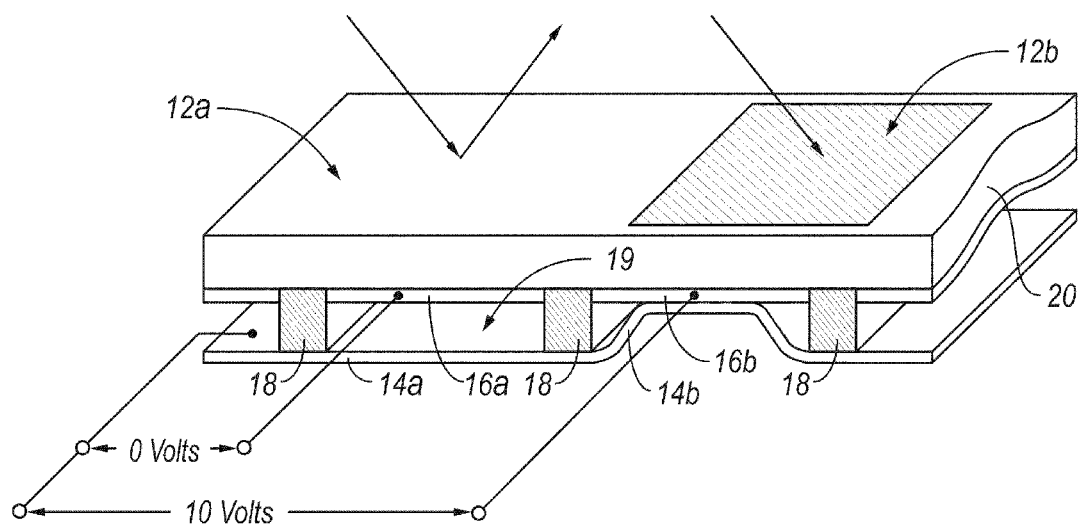
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
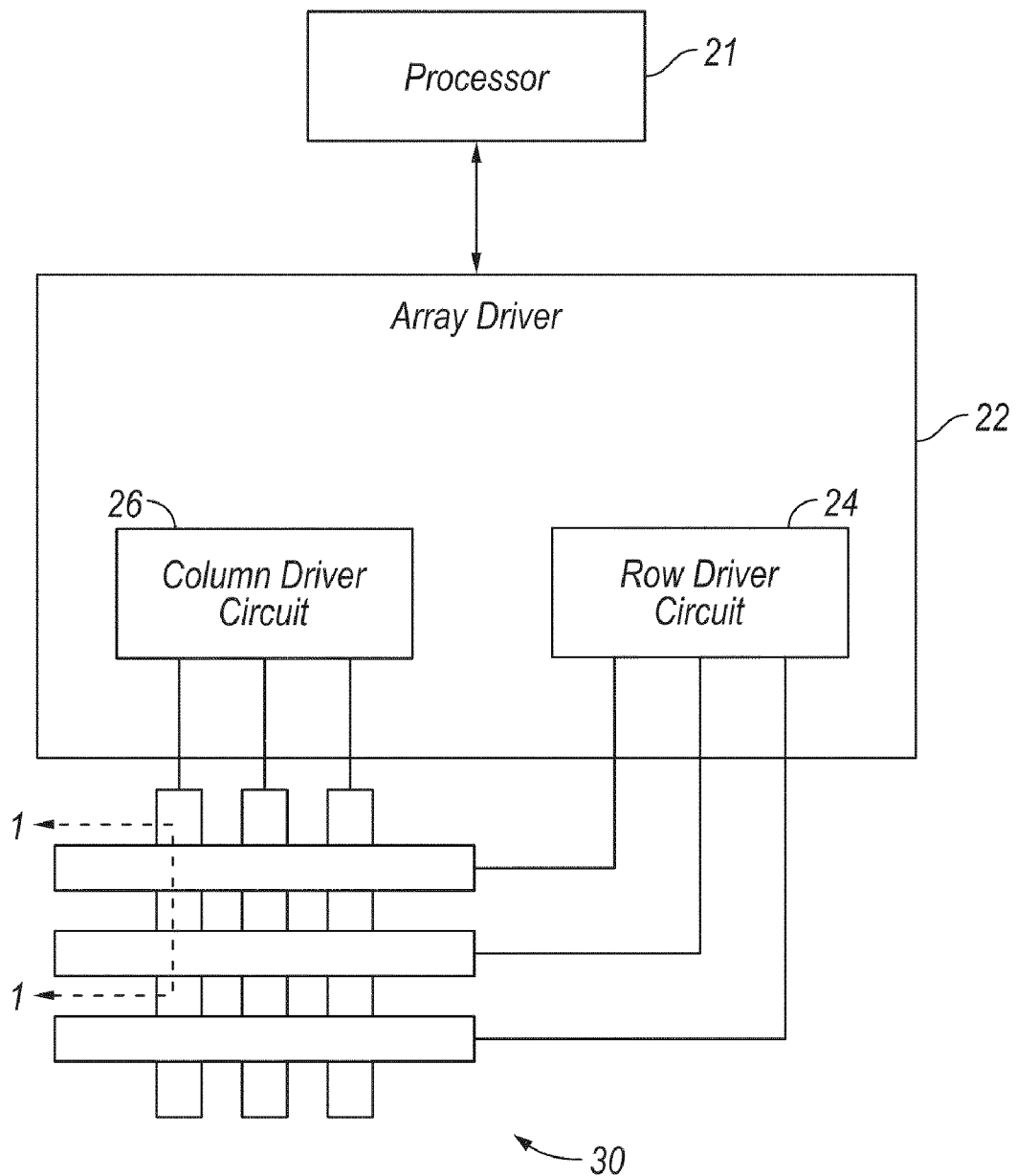
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
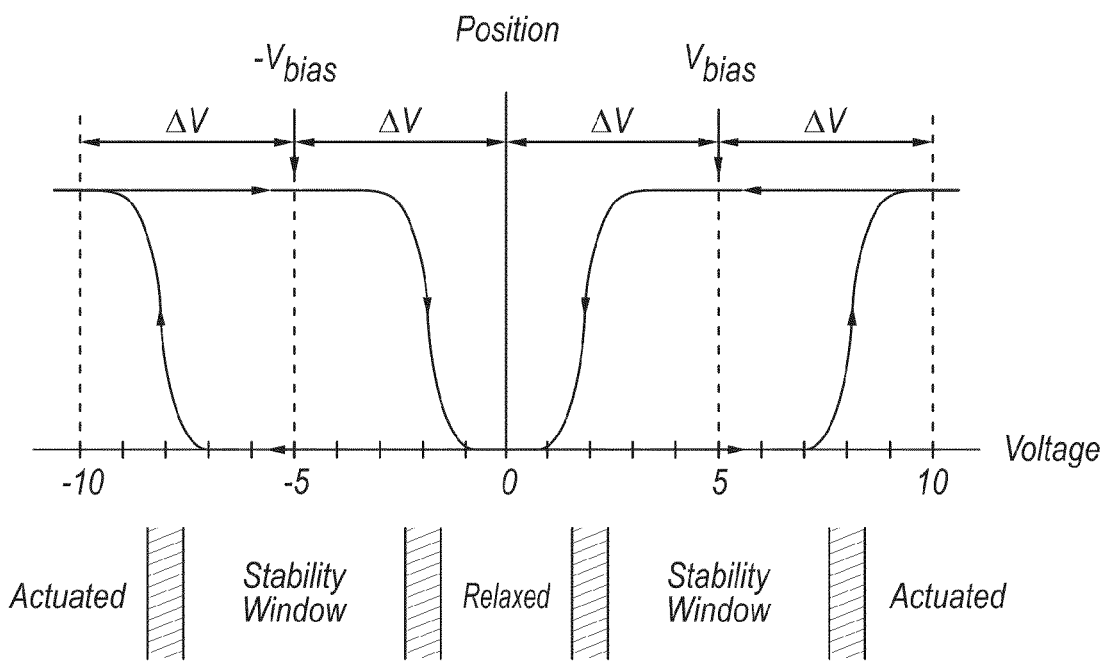
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
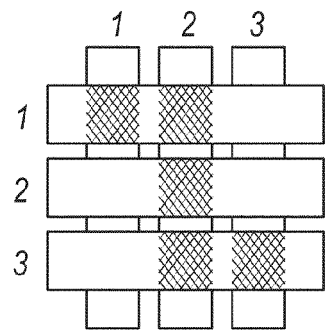
FIG. 5A illustrates one exemplary frame of display data in the 3×3 interferometric modulator display of FIG. 2.
Figure 5B:
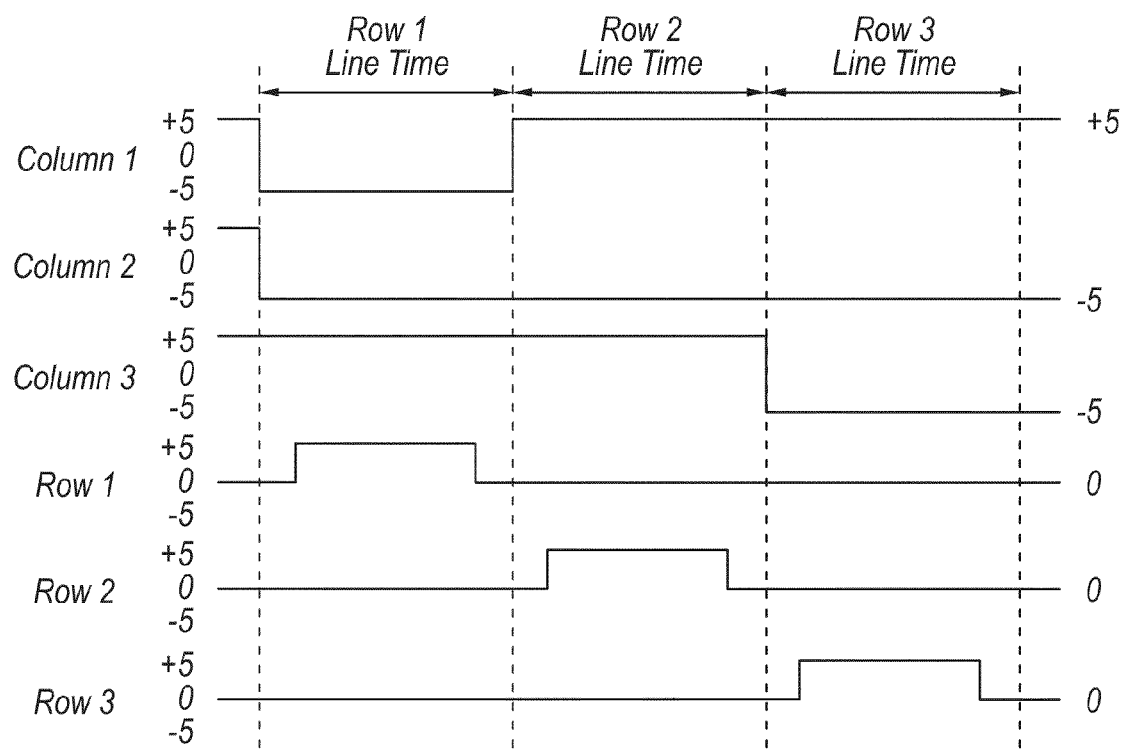
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to +ΔV, which may correspond to −5 volts and +5 volts respectively Relaxing the pixel is accomplished by setting the appropriate column to +$V_{bias}$, and the appropriate row to the same +ΔV, producing a zero volt potential difference across the pixel. In those rows where the row voltage is held at zero volts, the pixels are stable in whatever state they were originally in, regardless of whether the column is at +$V_{bias}$, or −$V_{bias}$. As is also illustrated in FIG. 4, it will be appreciated that voltages of opposite polarity than those described above can be used, e.g., actuating a pixel can involve setting the appropriate column to +$V_{bias}$, and the appropriate row to −ΔV. In this embodiment, releasing the pixel is accomplished by setting the appropriate column to −$V_{bias}$, and the appropriate row to the same −ΔV, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
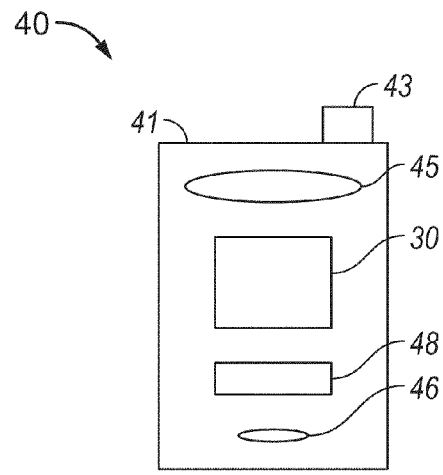
FIGS. 6A and 6B are system block diagrams illustrating an embodiment of a visual display device comprising a plurality of interferometric modulators.
Figure 6B:
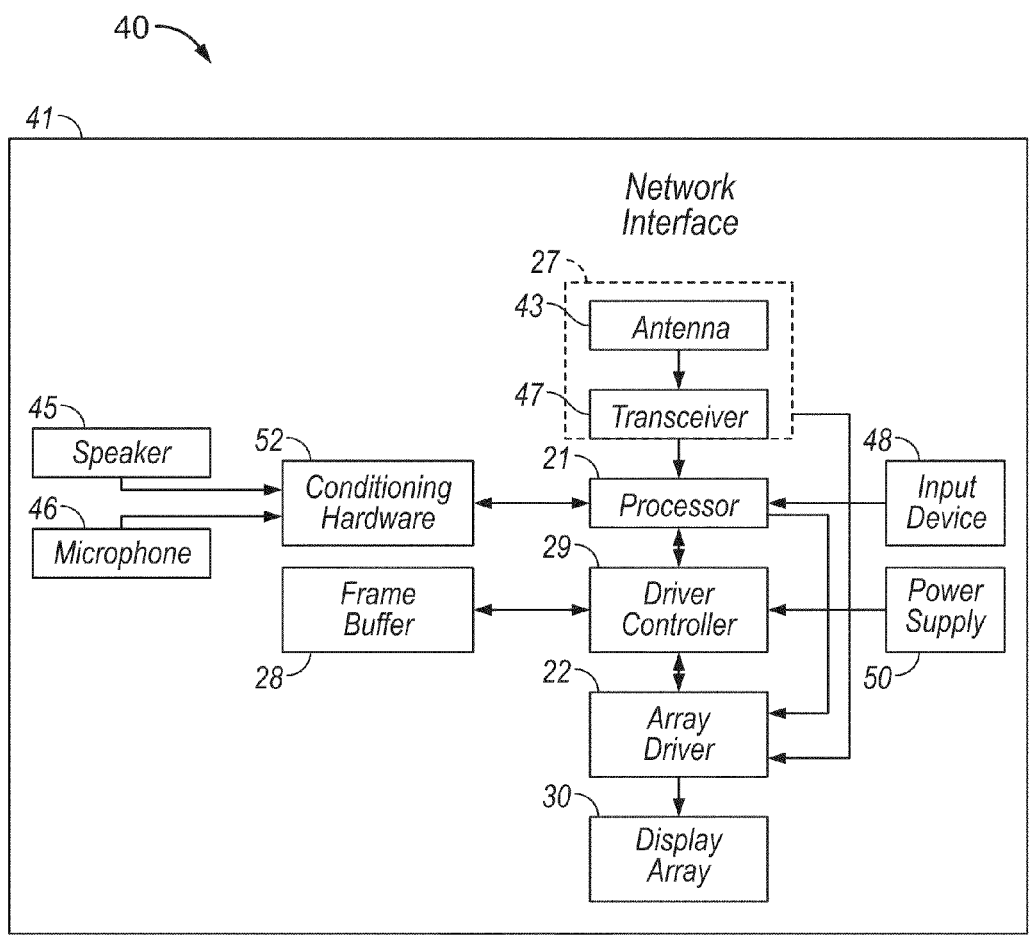

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
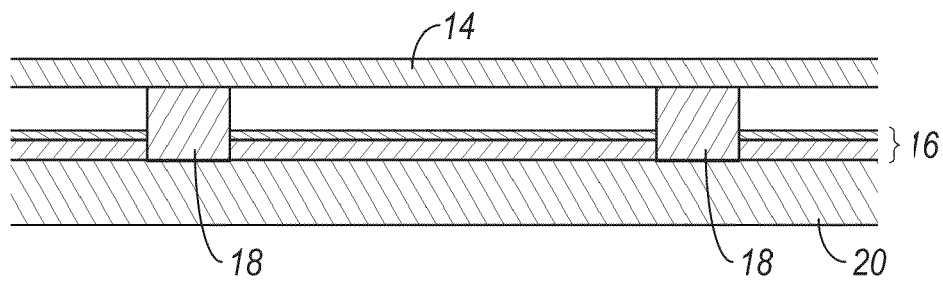
FIG. 7A is a cross section of the device of FIG. 1.
Figure 7B:
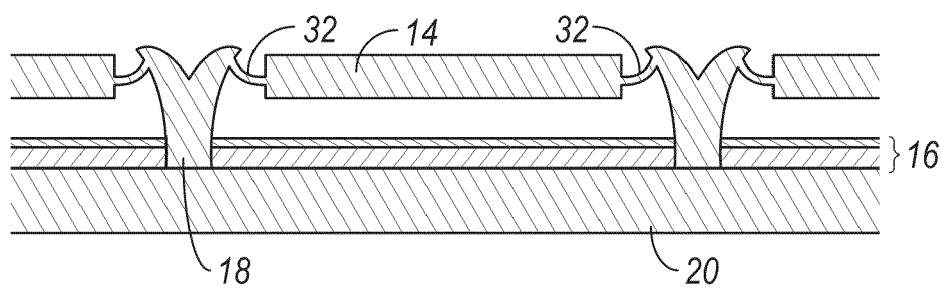
FIG. 7B is a cross section of an alternative embodiment of an interferometric modulator.
Figure 7C:
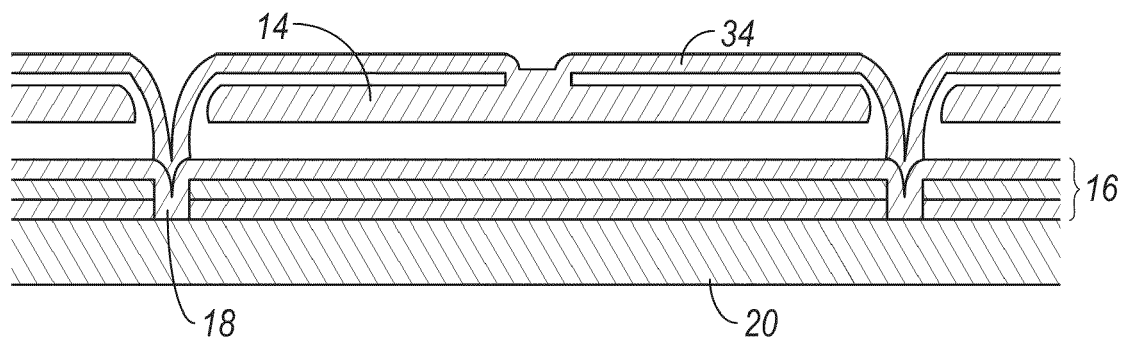
FIG. 7C is a cross section of another alternative embodiment of an interferometric modulator.
Figure 7D:
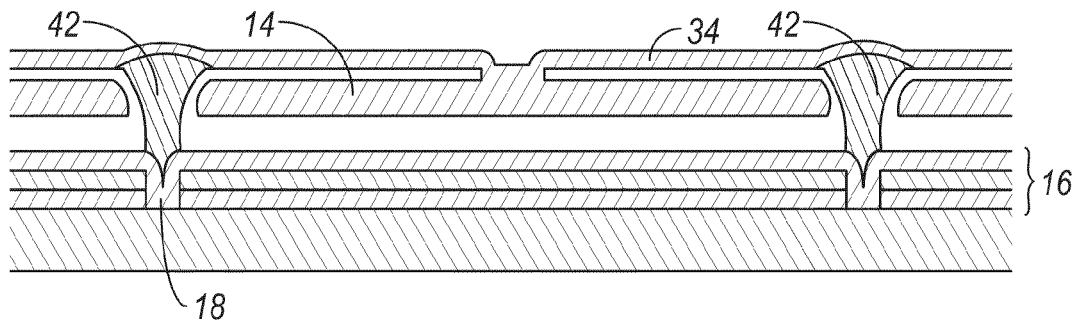
FIG. 7D is a cross section of yet another alternative embodiment of an interferometric modulator.
Figure 7E:
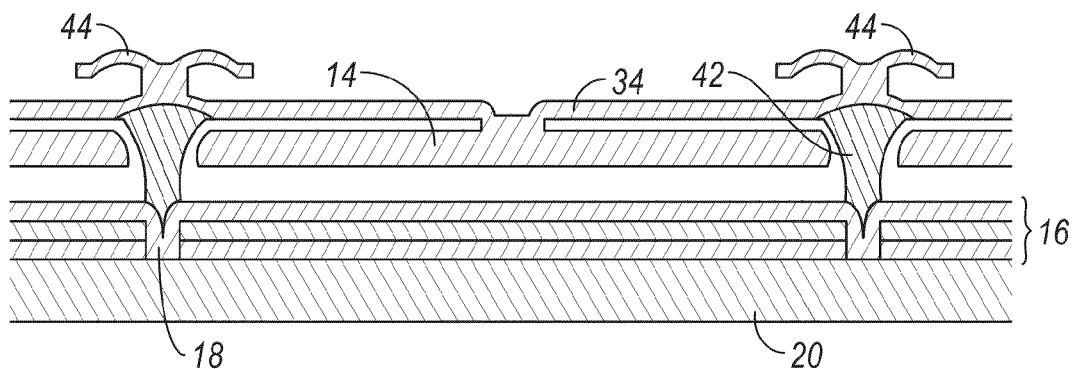
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. The connections are herein referred to as supports or posts 18. The embodiment illustrated in FIG. 7D has supports 18 including support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from the mechanical properties of the modulator, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

The interferometric modulators described above may be manufactured using any suitable manufacturing techniques known in the art for making MEMS devices. For example, the various material layers making up the interferometric modulators may be sequentially deposited onto a transparent substrate with appropriate patterning and etching steps conducted between deposition steps. Because materials in the interferometric modulators are deposited adjacent to each other, interaction can occur between the materials. In some cases, this interaction has negative effects on the manufacturing and/or the properties of the final device. For example, formation of alloys or compounds due to the interaction of two layers can cause incomplete etching because the etchants used may not be effective at removing the alloy or compound. In addition, the formation of unintended alloys or compounds may alter the physical characteristics of the layers, such as by altering tensile stress.

In some embodiments, multiple layers may be deposited during interferometric modulator manufacturing without any etching steps between the deposition steps. For example, the movable reflective layer described above may consist of a composite structure having two or more layers. In one embodiment, one layer provides high reflectivity characteristics while the second layer provides a mechanical support for the reflective layer. The composition and thicknesses of the layers determine the tensile stress present in the movable reflective layer. If the tensile stress is too low, the movable reflective layer may sag when in the relaxed state and may not rebound well after actuation. If the tensile stress is too high, the movable reflective layer may not actuate or may delaminate or buckle during manufacture. The composition and thicknesses of the layers also affect the robustness of the movable reflective layer.

Figure 8:
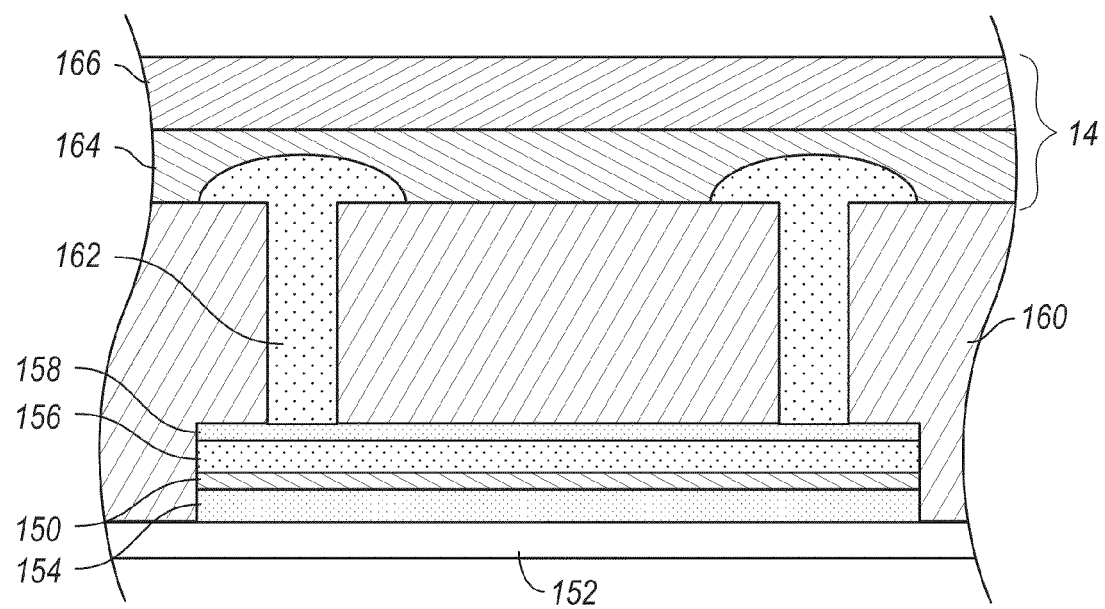
FIG. 8 is a cross section of an interferometric modulator prior to release etch.

One interferometric modulator design utilizing a composite movable reflective layer is depicted in FIG. 8. During manufacturing, a layer of indium-tin-oxide (ITO) 154 is deposited onto a transparent substrate 152. The ITO 154, which is a transparent conductor, provides a conductive plate so that a voltage can be applied between the movable reflective layer in the interferometric modulator and the plate. In one embodiment, the ITO is about 500 Å thick. Next, a layer of chrome 150 is deposited. In one embodiment, the chrome 150 is relatively thin (e.g., preferably between about 50 Å and 150 Å, in one embodiment, 70 Å), allowing it to act as a partial reflector. Alternatively, the chrome layer 150 may be deposited onto the substrate 152 followed by the ITO layer 154. Next, a dielectric layer 156/158 is deposited. The dielectric layer may consist of one or more oxides. In some embodiments, the dielectric layer 156/158 may be a composite layer. For example, a relatively thick layer of $SiO_2$ 156 (e.g., preferably between 300 Å and 600 Å, in one embodiment, approximately 450 Å) may be deposited followed by a thin layer of $Al_2O_3$ 158 (e.g., preferably between about 50 Å and 150 Å, in one embodiment, 70 Å) to protect the $SiO_2$ 156. In some embodiments, three or more oxide layers may be used (e.g., $Al_2O_3$—$SiO_2$—$Al_2O_3$). The oxide layer 156/158 provides an insulating layer between the movable reflective layer and the chrome 150. The thickness of the layer determines the interference properties of the interferometric modulator, particularly when it is in an actuated state. Dielectric sub layers can also be used to act as etch stops during patterning or removal of the sacrificial layer (described below) or as charge trapping layers. The layers described above correspond to the optical stack 16 described above with respect to FIGS. 1 and 7A-7E. These layers may be patterned and etched to form the rows in an interferometric modulator display.

In the next step, a sacrificial layer 160 is deposited (e.g., preferably between about 1000 Å and 3000 Å, in one embodiment, approximately 2000 Å). The sacrificial layer provides a space filling material that can be easily etched away without affecting the other materials. In one embodiment, the sacrificial layer 160 is molybdenum. Other examples of suitable materials for the sacrificial layer include polysilicon, amorphous silicon, or photoresist. In the last step of manufacturing, the sacrificial layer 160 will be etched away to create an air gap between the movable reflective layer and the dielectric layer or stack 156,158. Patterning and etching of the sacrificial layer 160 may be used to create holes and trenches in the layer for the formation of posts and rails that will support the movable reflective layer. Planar material 162 may be applied to fill the holes and form the posts. Finally, the movable reflective layer 164/166 is formed. In one embodiment, the movable reflective layer 14 is formed. In one embodiment, the movable reflective layer 14 includes a reflective layer 164 and a mechanical layer 166 supporting the reflective layer 164. In one embodiment, the reflective layer 164 is an aluminum layer (e.g., preferably between about 300 Å and about 1500 Å thick, in one embodiment, approximately 500 Å) and the mechanical layer 166 is a nickel layer (e.g., preferably between about 500 Å and about 2000 Å, in one embodiment, approximately 1450 Å). In some embodiments, an additional aluminum layer is added on top of the nickel layer 166 to provide better adhesion of photoresist used during patterning. The movable reflective layer 14 may be patterned and etched to form the columns in an interferometric modulator display.

After etching away the sacrificial layer 160 in the structure depicted in FIG. 8, an interferometric modulator similar to that depicted in FIG. 7A is obtained. In some embodiments, a dark mask layer may be added to the transparent substrate 152 prior to addition of the other layers. The dark mask layer may be patterned to reduce reflection from portions of the structure such as posts or rails. In some embodiments, the dark mask layer includes a MoCr layer and an oxide layer. Those of skill in the art will appreciate that patterning and etching steps in addition to those mentioned here may be used to form an interferometric modulator. Furthermore, it will be appreciated that other structures of interferometric modulators are possible, as for example depicted in FIGS. 7B-7E.

As noted above, in some embodiments the movable reflective layer consists of a reflective layer 164 and a mechanical layer 166. In one embodiment, a mechanical layer 166 is chosen to have a higher Young's modulus than the reflective layer 164, thus enhancing the mechanical properties of the composite movable reflective layer 14. For example, nickel has a higher Young's modulus than aluminum. However, nickel is not commonly used in the foundry processes typically found in MEMS and liquid crystal display (LCD) manufacturing facilities. Accordingly, use of nickel in interferometric modulators increases the expense for mass production of interferometric modulator based displays. An alternative to nickel for the mechanical support is chromium, which also has a higher Young's modulus than aluminum. Chromium is a standard material used in typical foundry processes. However, during deposition of chromium onto the aluminum layer, chromium and aluminum mix to form an alloy at their interface. Alloy formation between aluminum and chromium, as well as between other metallic materials, may occur due to effects such as the galvanic effect (diffusion of atoms due to a difference in electropotential), thermal migration (e.g., during hot deposition processes), and electro-migration (e.g., migration caused by application of an electric field). The formation of an alloy can create problems during manufacturing. For example, the alloy may not be sensitive to the etchant used to etch the two separate metals. In the case of Al—Cr, neither the CR14 used to etch chromium nor PAN used to etch aluminum is effective at completely etching Al—Cr alloy. In addition, alloy formation can alter the mechanical properties of the composite structure in an undesirable way.

Figure 9A:
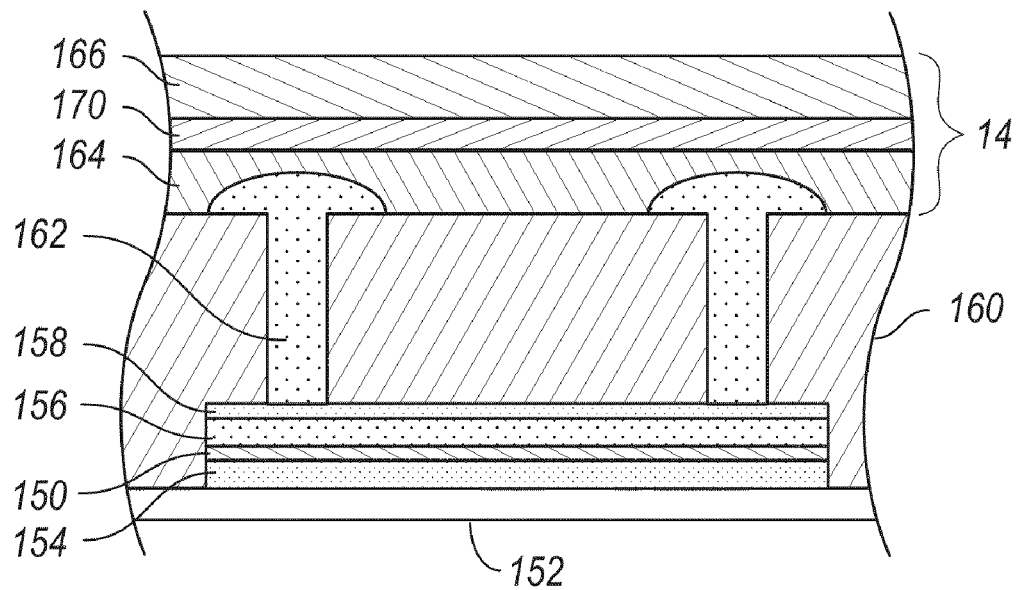
FIG. 9A is a cross section of an interferometric modulator prior to release containing a diffusion barrier layer.
Figure 9B:
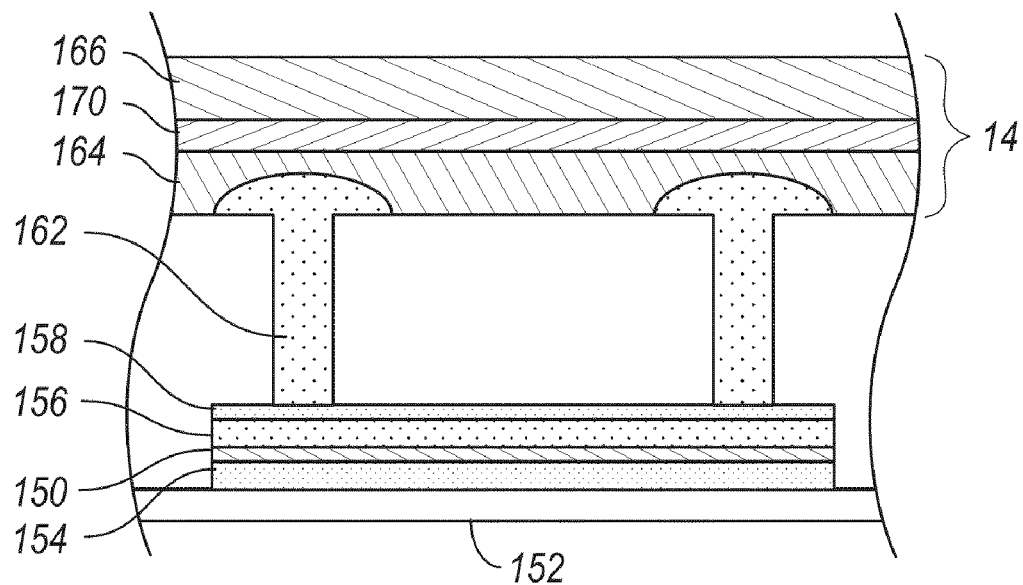
FIG. 9B is a cross section of an interferometric modulator containing a diffusion barrier layer after release etching.

Accordingly, provided herein are diffusion barriers disposed between two layers to prevent substantial diffusion between the two layers. For example, the barrier may be positioned between the reflective and mechanical support layers in an interferometric modulator array movable reflective layer 14. In some embodiments, one or both of the layers between which diffusion is prevented are metallic. As depicted in FIG. 9A, the manufacturing described above with respect to FIG. 8 may be altered so that an additional diffusion barrier layer 170 is deposited in the movable reflective layer 14 between the metallic reflective layer 164 and the metallic mechanical support layer 166. FIG. 9B depicts the resulting interferometric modulator structure after the sacrificial layer 160 has been removed by release etching. The diffusion barrier layer 170 remains part of the movable reflective layer 14 during operation of the interferometric modulator.

In some embodiments, the diffusion barrier layer includes a carbide, nitride, oxide, or boride. Non-limiting examples of suitable materials include silicon dioxide, aluminum oxide, $Si_3N_4$, titanium nitride, tantalum nitride, silicon carbide, titanium carbide, alumino silicate, and $TiB_2$. In other embodiments, the diffusion barrier layer includes a metal or metal alloy. Non-limiting examples include titanium, tungsten, titanium-tungsten alloy, silicon, and tantalum. The diffusion barrier layer may be deposited using any suitable technique known in the art, such as physical vapor deposition, chemical vapor deposition, or sol gel processing. The thickness of the diffusion barrier layer may be any thickness suitable for substantially inhibiting interdiffusion of materials on either side of the layer. In one embodiment, the thickness is preferably greater than about 15 Å, more preferably between about 30 angstroms and about 100 angstroms. During processing, an etchant that is active against the diffusion barrier material may be used to appropriately pattern structures that contain the diffusion barrier. For example, when silicon dioxide is used, PAD etchant may be used. When a composite structure containing a diffusion barrier layer needs to be patterned, it can be done so with a series of etchants. For example, a movable reflective layer containing aluminum/silicon dioxide/chromium can be patterned and etched using sequentially CR14, PAD, and PAN as etchants. During each etching step, the underlying material acts as an etch stop for the etching of the above material. Thus, for example, while etching chromium with CR14, the underlying silicon dioxide acts as an etch stop for the etching of the chromium.

When the diffusion barrier layer is an insulator, either the metallic reflective layer 164 or the metallic mechanical support layer 166 may be connected to leads for driving an interferometric modulator array. For example, voltage applied between the metallic mechanical support layer 166 and the ITO 154 layers may be used to cause the entire movable reflective layer 14 to collapse against the dielectric stack 156,158. Alternatively, the voltage may be applied between the metallic reflective layer 164 and the ITO 154 layer.

Figure 10:
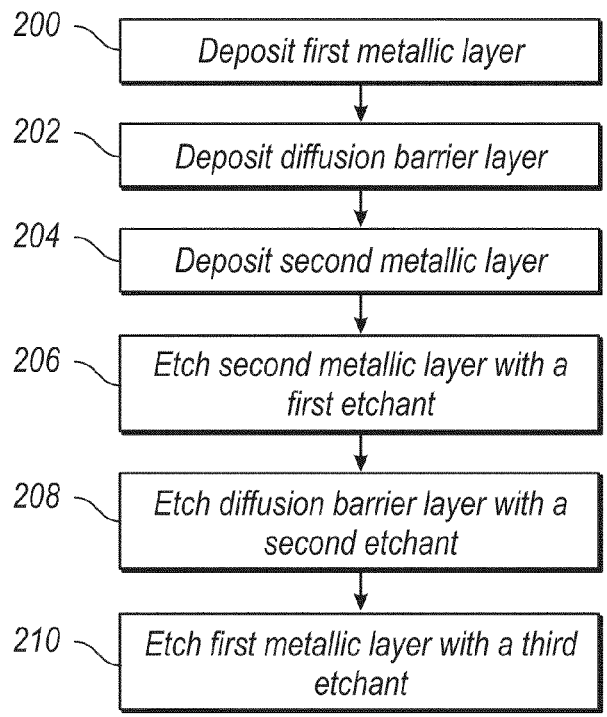
FIG. 10 is a flow chart illustrating a process for manufacture of a MEMS structure with a diffusion barrier layer.

Thus, in one embodiment, a method is provided for manufacturing a MEMS structure having at least two metallic layers that includes a diffusion barrier layer therebetween. FIG. 10 depicts a flowchart for such a method. At block 200, the first metallic layer is deposited. For example, the first metallic layer may be aluminum deposited on the sacrificial layer during interferometric modulator manufacturing. At block 202, the diffusion barrier layer is deposited on top of the first metallic layer. At block 204, the second metallic layer is deposited on top of the diffusion barrier layer. Next, the three layers are patterned and etched. In one embodiment, three different etchants are used and the three layers are sequentially etched. For example, at block 206, the second metallic layer may be etched with a first etchant. Next, at block 208 the diffusion barrier layer may be etched with a second etchant. Finally, at block 210, the first metallic layer may be etched with a third etchant. The same pattern may applied to all three layers during etching. For example, a single layer of photo resist may be applied to the second metallic layer followed by exposure to a single pattern. Sequential etching after developing the photo resist will cause the same pattern to be etched in all three layers. After the second metallic layer is etched, it can also act as a hard mask during etching of the diffusion barrier layer. Similarly, after the diffusion barrier is etched, it can act as a hard mask during etching of the first metallic layer. Depending on the particular embodiment, steps may be added to those depicted in the flowcharts presented herein or some steps may be removed. In addition, the order of steps may be rearranged depending on the application.

Although the diffusion barrier layer has been described above for use between aluminum and chromium, it will be appreciated that it may be advantageously employed between any two materials that have the potential to mix at their interface. For example, non-limiting examples of materials other than chromium that potentially mix with aluminum include titanium, copper, iron, silicon, manganese, magnesium, lithium, silver, gold, nickel, tantalum, and tungsten.

It will also be appreciated that the diffusion barrier layers described herein may be used in MEMS structures other than the interferometric modulator movable reflective layers described above. In general, such a diffusion barrier layer may be employed between any two metallic layers in a MEMS device. For example, many mechanical membranes in MEMS devices may require composite layers, such as in the movable reflective layer described above. The use of a diffusion barrier layer expands the number of metals that may be used in composite mechanical membranes. The barrier layer may be particularly useful when a composite structure is needed and it is important that the individual materials have separate properties, for example where one material requires certain optical properties and the other requires certain mechanical and/or electrical properties.

It will also be appreciated that in some embodiments, as for example described above, the diffusion barrier layer may act as an etch stop during MEMS manufacture. In addition to acting as an etch stop for chromium in an aluminum/silicon dioxide/chromium movable reflective layer, the diffusion barrier layers described herein can also be deposited between a sacrificial layer and the movable reflective layer during manufacture of an interferometric modulator. The diffusion barrier layer in this example both prevents interdiffusion between the sacrificial layer material (e.g., molybdenum) and the adjacent material in the movable reflective layer (e.g., aluminum), thereby protecting the sacrificial layer during etching of the adjacent material in the movable reflective layer.

In some embodiments, a composite MEMS structure is provided having two metallic layers with a diffusion barrier layer therebetween as described above. In some embodiments, the thicknesses of all three materials are chosen to optimize the desired physical properties of the composite structure. Physical properties that may be considered include, but are not limited to, optical properties, electrical properties, thermal properties, and mechanical properties. For example, it may be desirable that a mechanical membrane have a specified tensile stress so that it has certain desired mechanical properties as well as survives the manufacturing process. The examples of metallic layers described herein increases tensile stress, while the diffusion barrier materials described herein, which are characterized by predominantly compressive stress and have a higher modulus of elasticity, decreases tensile stress. Accordingly, in some embodiments, a method is provided for obtaining a mechanical membrane in a MEMS device having a desired tensile stress.

Figure 11:
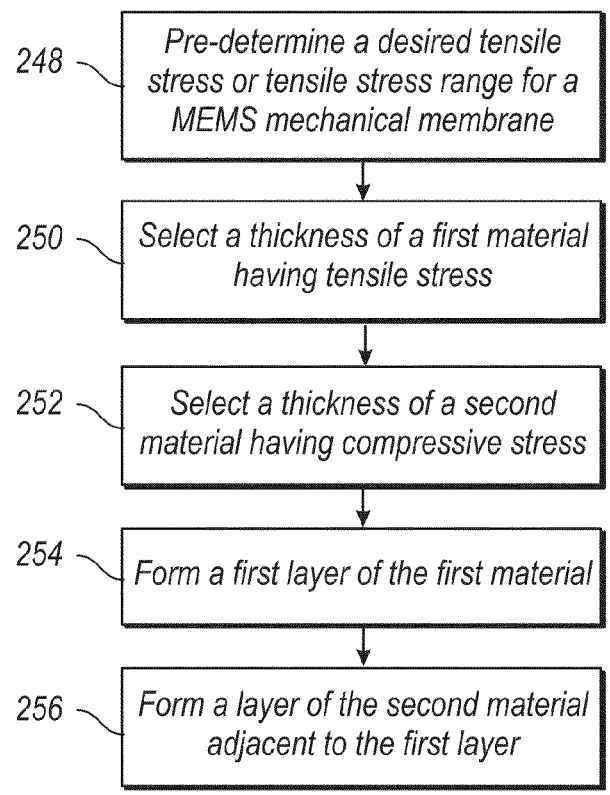
FIG. 11 is a flow chart illustrating a process for tailoring tensile stress in a composite MEMS structure.

FIG. 11 depicts a flow chart for one such method. At block 248, a desired tensile stress or range of tensile stress is predetermined based on the particular application of the mechanical membrane. At block 250, the thickness of a first material having tensile stress is selected (e.g., a metallic material) based at least in part on the pre-determined overall tensile stress desired for the mechanical membrane. At block 252, the thickness of a second material having compressive stress is selected (e.g., a diffusion barrier material) based at least in part on the pre-determined overall tensile stress desired for the mechanical membrane. Next, at block 254, a layer of the first material is formed. Finally, at block 256, a layer of the second material is formed adjacent to the first material. The combination of the tensile stress in the first material and the compressive stress in the second material gives rise to a combined tensile stress for the mechanical membrane. It will be appreciated that additional layers having tensile stress or compressive stress may be added. For example, when the compressive stress material is also acting as a diffusion barrier, three layers may be included as described above.

In some embodiments, an interferometric modulator movable reflective layer is provided that consists of an aluminum-silicon dioxide-chromium composite structure. In some embodiments, the silicon dioxide has a thickness of preferably at least about 15 angstroms, more preferably between about 30 angstroms and about 100 angstroms. In some embodiments, the thickness of the aluminum layer is preferably between about 200 angstroms and about 2000 angstroms, more preferably between about 800 angstroms and about 1200 angstroms. In some embodiments, the thickness of the chromium layer is preferably between about 80 angstroms and about 1000 angstroms, more preferably between about 100 angstroms and about 500 angstroms.

EXAMPLES

Example 1

Measurements of Residual Stress

Several film stacks containing various thicknesses of aluminum and chromium, with and without a silicon dioxide diffusion barrier, were deposited onto a p type silicon monitor wafer. The curvature of the silicon wafer was measured before and after deposition using laser reflectance. This curvature was used with the Stoney equation to provide a measurement of residual stress in the film stacks. The film stacks were deposited using a MRC 693 sputtering system. Table 1 lists the various film stacks manufactured and the resulting residual stress. For comparison, a nominal Al(300 Å)/Ni (1000 Å) film stack was found to have an average residual stress between about 250 and 300 MPa.

TABLE 1

Residual stress of Al/Cr film stacks.

| Wafer ID | Film stacks | Average measured tensile stress (MPa) |
|---|---|---|
| 111-3 | Al(1000 Å)/Cr(200 Å) | 220 |
| 111-6 | Al(1500 Å)/Cr(350 Å) | 130 |
| 111-8 | Al(1000 Å)/SiO$_2$(20 Å)/Cr(200 Å) | 125 |
| 111-10 | Al(1000 Å)/SiO$_2$(20 Å)/Cr(100 Å) | 80 |
| 103-4 | Al(1000 Å)/SiO$_2$(40 Å)/Cr(150 Å) | 120 |
| 71-7 | Al(1000 Å)/SiO$_2$(40 Å)/Cr(850 Å) | 245 |

It was seen that thicker chromium films increased the tensile stress of the film stacks. Furthermore, a separate experiment indicated that the residual stress of a 1000 Å aluminum film was 10 MPa and a 350 Å silicon dioxide film was −123 MPa. Accordingly, these experiments demonstrate that adjusting the silicon dioxide and chromium thicknesses can be used to tailor the residual stress of mechanical layers containing Al/SiO$_2$/Cr. In one embodiment the preferred tensile stress for the movable reflective layer in an interferometric modulator is between about 100 MPa and about 500 MPa, more preferably between about 300 MPa and about 500 MPa, and most preferably about 350 MPa.

Example 2

Manufacture of Interferometric Modulators Containing a Diffusion Barrier

The film stacks described in Example 1 were used to manufacture movable reflective layers in an interferometric modulator array. The film stacks were deposited using a MRC 693 sputtering system on 1.1.4+ monochrome glass wafers after deposition of the optical stack, molybdenum sacrificial layer, and deposition of planarization material. The movable reflective layer film stacks were patterned and etched using sequentially CR14, PAD, and PAN etchants. In the stacks lacking silicon dioxide, the PAD etchant was excluded. The molybdenum sacrificial layer was removed with a dry XeF$_2$ release etch in 2 cycles with 120 seconds fill time and 300 seconds dwell time. Table 2 indicates the movable reflective layer etchants used on each wafer.

TABLE 2

Interferometric modulator movable reflective layer etchants

| Wafer ID | Film stacks | Etchants |
|---|---|---|
| 111-3 | Al(1000 Å)/Cr(200 Å) | CR14 (25 s) + PAN (258 s) |
| 111-6 | Al(1500 Å)/Cr(350 Å) | CR14 (33 s) + PAN (351 s) |
| 111-8 | Al(1000 Å)/SiO$_2$(20 Å)/Cr(200 Å) | CR14 (65 s) + PAD (10 s) + PAN (165 s) |
| 111-10 | Al(1000 Å)/SiO$_2$(20 Å)/Cr(100 Å) | CR14 (26 s) + PAD (10 s) + PAN (165 s) |
| 103-4 | Al(1000 Å)/SiO$_2$(40 Å)/Cr(150 Å) | CR14 (26 s) + PAD (4 s) + PAN (165 s) |
| 71-7 | Al(1000 Å)/SiO$_2$(40 Å)/Cr(850 Å) | CR14 (84 s) + PAD (4 s) + PAN (165 s) |

Figure 12:
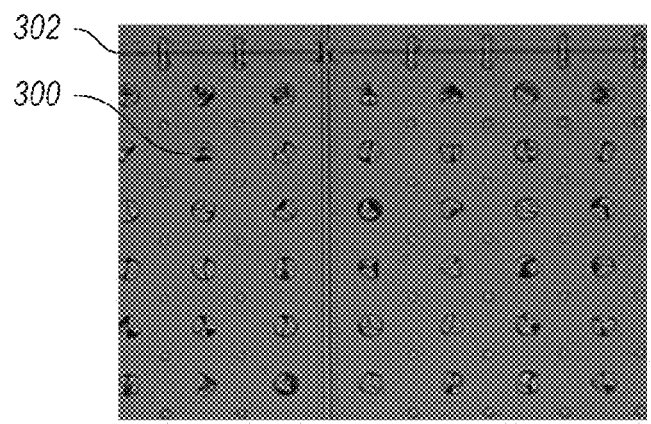
FIG. 12 is a micrograph of the process side of an interferometric modulator having an Al/Cr movable reflective layer.

The etching of the interferometric modulators containing aluminum and chromium without the silicon dioxide diffusion barrier was not successful. FIG. 12 depicts a micrograph of wafer 111-6 from the process side. The large circular patterns 300 indicate that the attempted etching to form etch holes (for entry of XeF$_2$ during the release etch) was not complete. In addition, the cuts 302 in the movable reflective layer to form columns were not well defined. The incomplete etching was attributed to the formation of AlCr alloy during processing, causing the sequential etch to be incomplete because CR14 is only effective on pure chromium and not AlCr alloy.

Figure 13A:
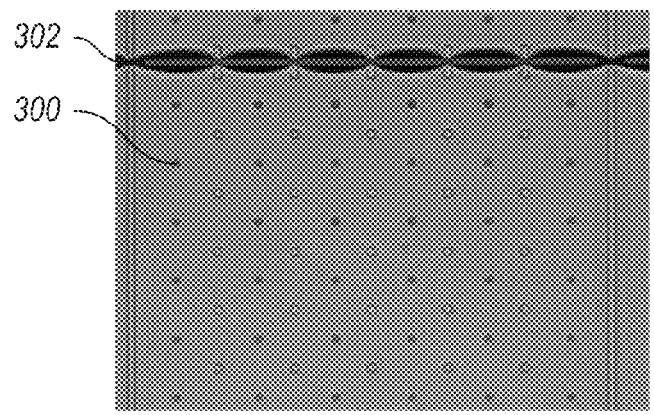
FIG. 13A is a micrograph of the process side of an interferometric modulator having an Al/SiO$_2$/Cr movable reflective layer.
Figure 13B:
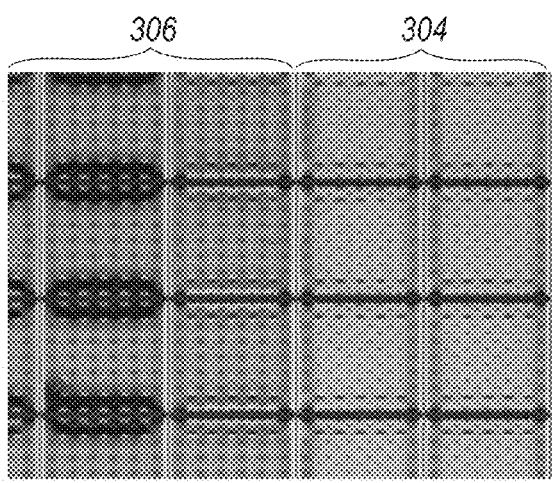
FIG. 13B is a micrograph of the glass side of the interferometric modulator of FIG. 13A.
Figure 14A:
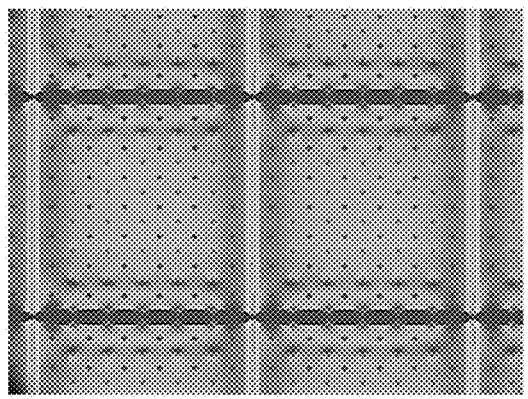
FIG. 14A is a micrograph of the interferometric modulator of FIGS. 13A and 13B in an unactuated state.
Figure 14B:
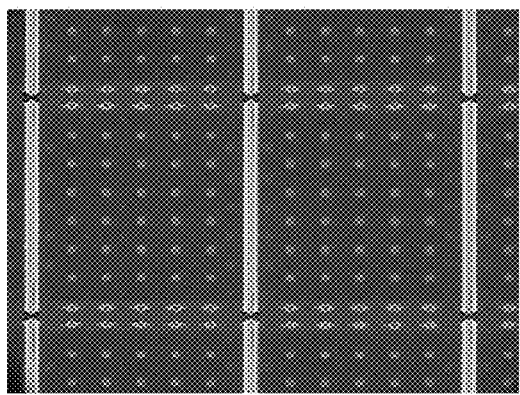
FIG. 14B is a micrograph of the interferometric modulator of FIGS. 13A and 13B in an actuated state.

In contrast including a thin film of silicon dioxide between the aluminum and chromium layers improved the etching. When 20 Å of silicon dioxide was included, etching was improved; however, higher chromium etching time (about twice as long as normal) was required and the etching of wafer 111-10 was not successful. FIG. 13A depicts a micrograph of wafer 111-8 from the process side, demonstrating good formation of etch holes 300 and column cuts 302. FIG. 13B is a micrograph of wafer 111-8 from the glass side. There seemed to be some sagging in the movable reflective layer as observed by a shift from the expected green color (pixels 304) to blue (pixels 306) in some of the interferometric modulators. FIGS. 14A and 14B compare wafer 111-8 prior to and after applying a 10V actuation potential, indicating that a change from a bright state to a dark state was observed. However, the movable reflective layer did not rebound after removing the applied potential, indicating high stiction or insufficient tensile stress.

Figure 15A:
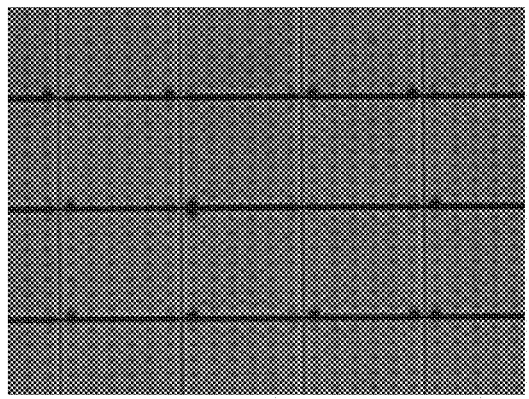
FIG. 15A is a micrograph of another interferometric modulator having an Al/SiO$_2$/Cr movable reflective layer at 50× magnification.
Figure 15B:
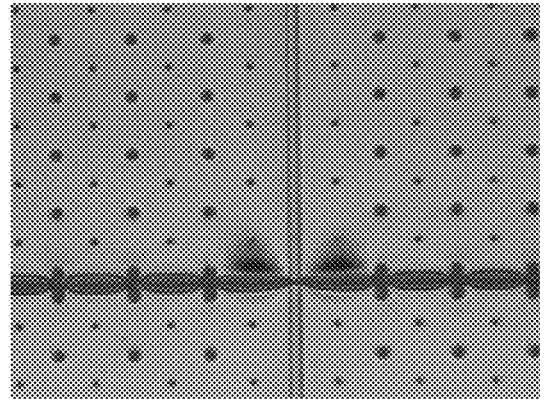
FIG. 15B is a micrograph of the interferometric modulator of FIG. 15A at 200× magnification.
Figure 16A:
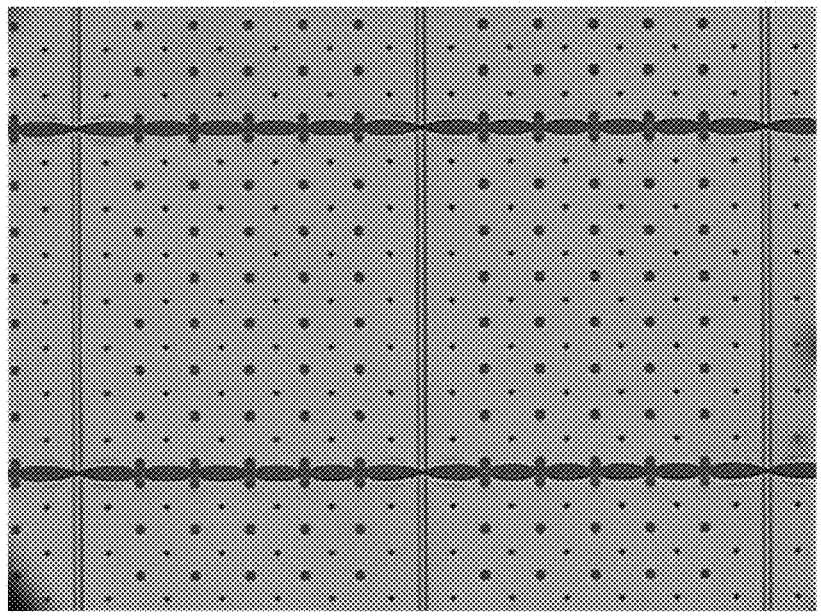
FIG. 16A is a micrograph of the interferometric modulator of FIGS. 15A and 15B in an unactuated state.
Figure 16B:
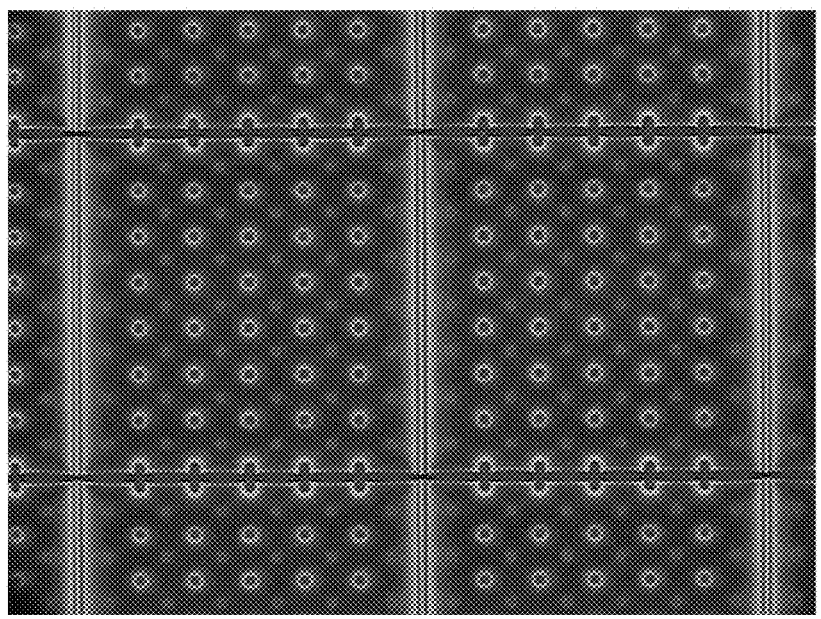
FIG. 16B is a micrograph of the interferometric modulator of FIGS. 15A and 15B in an actuated state.
Figure 17:
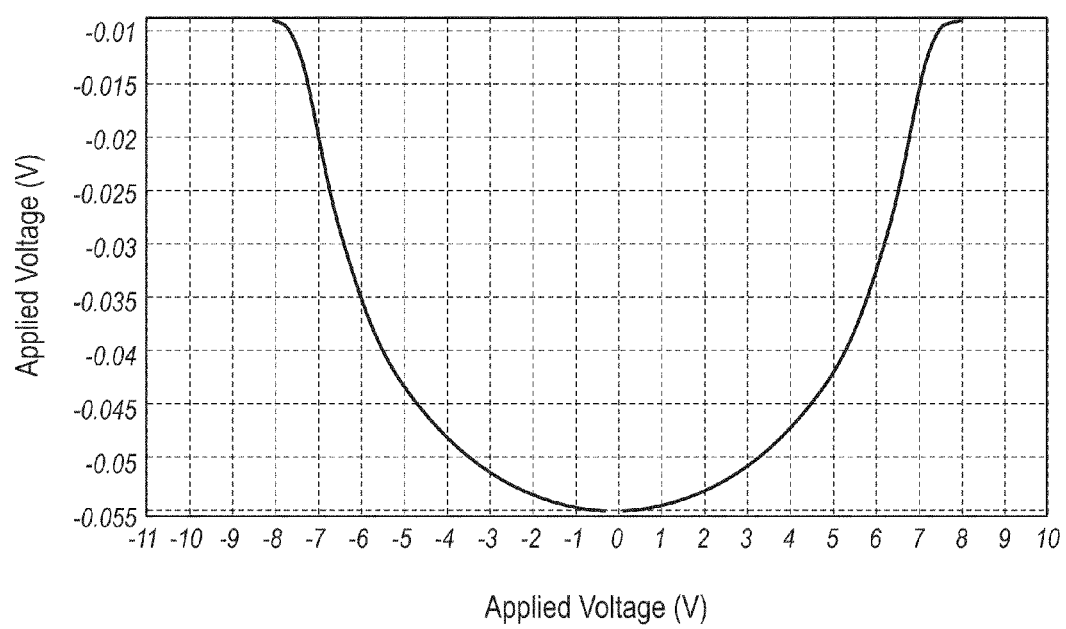
FIG. 17 is a graph of the optical response as a function of voltage of the interferometric modulator of FIGS. 15A and 15B.

Results were improved further by using a 40 Å silicon dioxide layer. The etching of wafer 103-4 was very successful. FIGS. 15A and 15B are micrographs depicting wafer 103-4 from the glass side at 50× (FIG. 14A) and 200× (FIG. 14B) magnification. FIGS. 16A and 16B compare wafer 103-4 prior to and after applying an 8V actuation potential, indicating that a change from a bright state to a dark state was observed. Furthermore, the movable reflective layer rebounded upon removal of the 8V actuation potential indicating low stiction was present. FIG. 17 depicts the optical response as a function of potential measured for wafer 103-4. Although no significant hysteresis was observed, the response was symmetric and consistent.

Figure 18A:
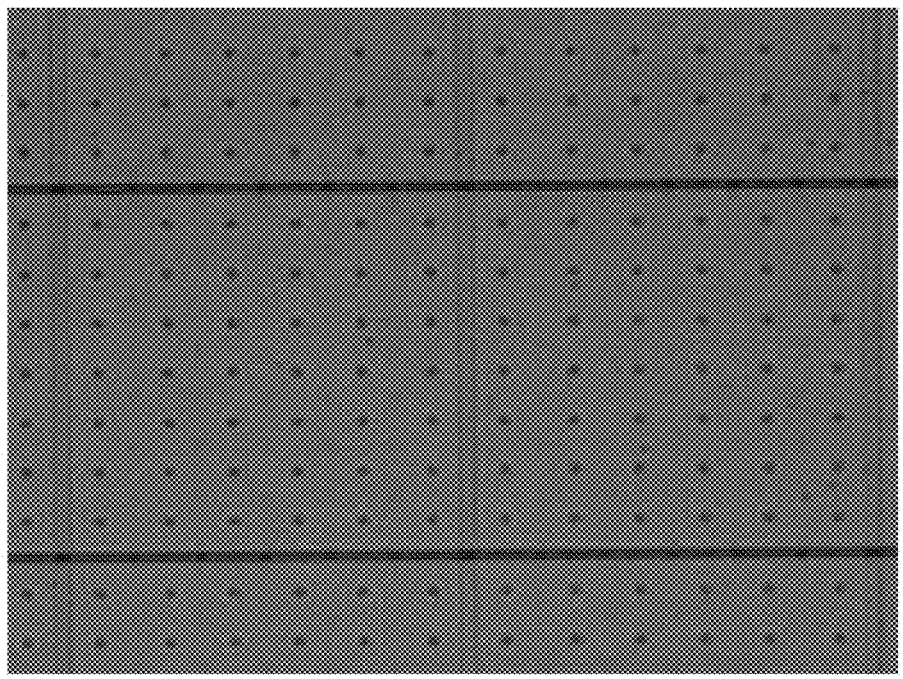
FIG. 18A is a micrograph of another interferometric modulator having an Al/SiO$_2$/Cr movable reflective layer prior to release etch.
Figure 18B:
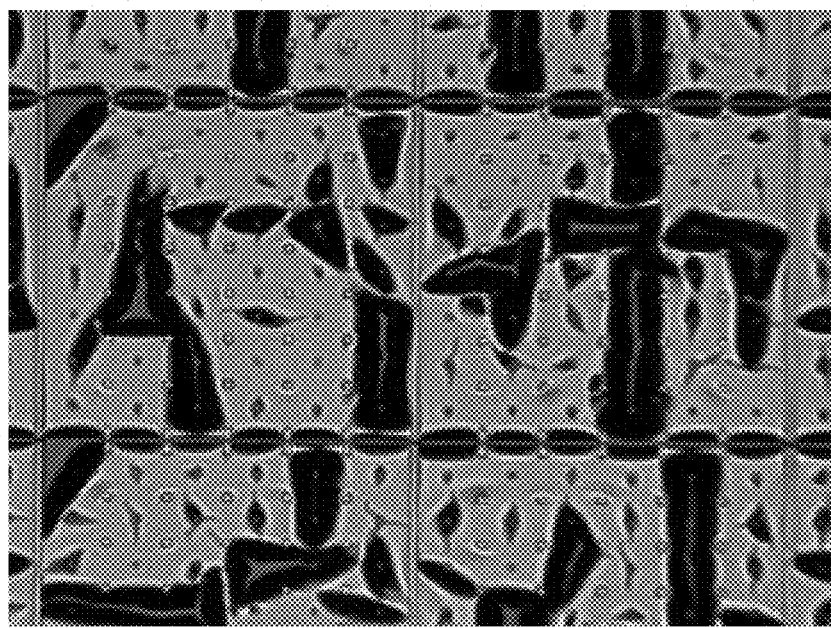
FIG. 18B is a micrograph of the interferometric modulator of FIG. 18A after release etch.

In wafer 71-7, the thickness of the chromium was significantly increased. FIG. 18A is a micrograph of this wafer prior to the release etch. The micrograph indicates good etching of the movable reflective layer layer, with well defined etch holes and column cuts. However, upon applying the $XeF_2$ release etch, the movable reflective layer fractured and collapsed as depicted in the micrograph in FIG. 18B. Accordingly, increasing the tensile stress by too much resulted in a damaged wafer. While not being bound to any particular theory, it is believed that further optimizing the tensile stress, such as by optimizing the silicon dioxide and chromium thicknesses, would likely provide improved hysteresis characteristics without resulting in damage to the movable reflective layer layer.

Although the invention has been described with reference to embodiments and examples, it should be understood that numerous and various modifications can be made without departing from the spirit of the invention. Accordingly, the invention is limited only by the following claims.

What is claimed is:

1. A method of manufacturing a MEMS device, comprising:
   depositing a first metallic layer comprising a first metal;
   depositing a diffusion barrier layer onto the first metallic layer;
   depositing a second metallic layer comprising a second metal onto the diffusion barrier layer, wherein the diffusion barrier layer is adapted to substantially inhibit any portion of the first metallic layer from mixing with any portion of the second metallic layer; and
   etching a same pattern in the first metallic layer, diffusion barrier layer, and second metallic layer,
   wherein etching the pattern in the second metallic layer comprises using a first etchant capable of etching the second metal but not an alloy of the first and second metal, and
   wherein etching the pattern in the first metallic layer comprises using a second etchant capable of etching the first metal but not an alloy of the first and second metal.

2. The method of claim 1, wherein the first metallic layer comprises aluminum.

3. The method of claim 1, wherein the second metallic layer comprises chromium.

4. The method of claim 1, wherein the diffusion barrier layer comprises an oxide, nitride, or carbide.

5. The method of claim 1, wherein the diffusion barrier layer comprises silicon dioxide.

6. The method of claim 1, wherein etching a same pattern comprises employing different etchants for each of the first metallic layer, diffusion barrier layer, and second metallic layer.

7. A MEMS device, comprising a mechanical membrane produced by the process of claim 1.

8. A method of manufacturing an interferometric modulator, comprising:
   depositing a first metallic layer comprising a first metal;
   depositing a diffusion barrier layer onto the first metallic layer;
   depositing a second metallic layer comprising a second metal onto the diffusion barrier layer, wherein the diffusion barrier layer is adapted to substantially inhibit any portion of the first metallic layer from mixing with any portion of the second metallic layer; and
   etching a same pattern in the second metallic layer, the diffusion barrier, and the first metallic layer,
   wherein etching the pattern in the second metallic layer comprises using a first etchant capable of etching the second metal but not an alloy of the first and second metal.

9. The method of claim 8, wherein etching the pattern in the diffusion barrier comprises using a second etchant, and etching the pattern in the first metallic layer comprises using a third etchant capable of etching the first metal but not an alloy of the first and second metal.

10. The method of claim 9, wherein the diffusion barrier layer and the second metallic layer are substantially resistant to the third etchant.

11. The method of claim 9, wherein the third etchant is PAN.

12. The method of claim 8, wherein the diffusion barrier layer comprises an oxide, nitride, or carbide.

13. The method of claim 8, wherein the diffusion barrier layer comprises silicon dioxide.

14. The method of claim 8, wherein the diffusion barrier layer and the first metallic layer are substantially resistant to the first etchant.

15. The method of claim 8, wherein the first metallic layer and the second metallic layer are substantially resistant to the second etchant.

16. The method of claim 8, wherein the first etchant is CR14.

17. The method of claim 8, wherein the second etchant is PAD.

18. An interferometric modulator produced by the process of claim 8.

19. A method of manufacturing a movable electrode in a MEMS device, the method comprising:
   forming one or more first layers of the movable electrode, the first layer(s) comprising a first material and having tensile stress, the first material comprising a first metal;
   forming one or more second layers of the movable electrode adjacent to the first layer(s), the second layer(s) comprising a second material and having compressive stress;
   forming one or more third layers of the movable electrode, the third layer(s) comprising a third material and having tensile stress, the third material comprising a second metal; and etching a pattern in the one or more third layers using a first etchant capable of etching the second metal but not an alloy of the first and second metal, whereby a combination of the first, second, and third layers provides a tensile residual stress for the movable electrode.

20. The method of claim 19, wherein the first metal is selected from the group consisting of aluminum, chromium, titanium, copper, iron, silicon, manganese, magnesium, lithium, silver, gold, nickel, tantalum, and tungsten.

21. The method of claim 19, wherein the second material is one or more of oxide, nitride, or carbide.

22. The method of claim 19, wherein at least one of the second layers comprises silicon dioxide.

23. A MEMS device movable electrode produced by the process of claim 19.

24. The method of claim 19, wherein the one or more second layers are between the one or more first layers and the one or more third layers.

25. The method of claim 19, further comprising etching a pattern in the one or more first layers using a second etchant capable of etching the first metal but not an alloy of the first and second metal.

26. The method of claim 19, wherein the tensile stress is between about 100MPa and 500 MPa.

* * * * *